(12) United States Patent
Obuchi et al.

(10) Patent No.: US 9,876,137 B2
(45) Date of Patent: Jan. 23, 2018

(54) SEMICONDUCTOR LIGHT EMITTING DEVICE

(71) Applicant: ROHM CO., LTD., Kyoto (JP)

(72) Inventors: Hirotaka Obuchi, Kyoto (JP); Kazuaki Tsutsumi, Kyoto (JP)

(73) Assignee: ROHM CO., LTD., Kyoto (JP)

( * ) Notice: Subject to any disclaimer, the term of this patent is extended or adjusted under 35 U.S.C. 154(b) by 0 days.

(21) Appl. No.: 15/154,397

(22) Filed: May 13, 2016

(65) Prior Publication Data

US 2016/0343900 A1    Nov. 24, 2016

(30) Foreign Application Priority Data

May 18, 2015 (JP) ................................. 2015-101322

(51) Int. Cl.
| H01L 29/06 | (2006.01) |
| H01L 27/15 | (2006.01) |
| H01L 33/00 | (2010.01) |
| H01L 33/06 | (2010.01) |
| H01L 33/32 | (2010.01) |

(52) U.S. Cl.
CPC .............. *H01L 33/06* (2013.01); *H01L 33/32* (2013.01); *H01L 33/325* (2013.01)

(58) Field of Classification Search
CPC ............................... H01L 33/06; H01L 33/325
USPC .......................... 257/13, 79, 98, E33.023, 99
See application file for complete search history.

(56) References Cited

U.S. PATENT DOCUMENTS

| 2004/0056259 A1* | 3/2004 | Goto ..................... B82Y 20/00 257/79 |
| 2005/0056824 A1* | 3/2005 | Bergmann ............. B82Y 20/00 257/14 |
| 2005/0098789 A1* | 5/2005 | Kozaki .................. B82Y 20/00 257/97 |
| 2009/0179190 A1* | 7/2009 | Nakahara ............... H01L 33/02 257/13 |
| 2010/0102341 A1* | 4/2010 | Tsutsumi ............... H01L 33/22 257/98 |
| 2013/0056748 A1* | 3/2013 | Matsui ................... H01L 33/22 257/76 |

FOREIGN PATENT DOCUMENTS

JP    2014-187159 A    10/2014

OTHER PUBLICATIONS

Japanese-English Machine translation of Japanese Patent Application No. 2014-187159.*

* cited by examiner

*Primary Examiner* — Dzung Tran
(74) *Attorney, Agent, or Firm* — Rabin & Berdo, P.C.

(57) ABSTRACT

A semiconductor light emitting device includes: an n-type layer; a p-type layer; and an emission layer interposed between the n-type layer and the p-type layer and having a multiple quantum well (MQW) structure in which barrier layers and quantum well layers are alternately stacked over a plurality of periods, wherein n-type impurity concentrations of the barrier layers disposed up to a predetermined α-th layer (where α is a natural number), when counting from the p-type layer, are smaller than an n-type impurity concentration of the barrier layer disposed at an (α+1)-th layer counting from the p-type layer.

19 Claims, 9 Drawing Sheets

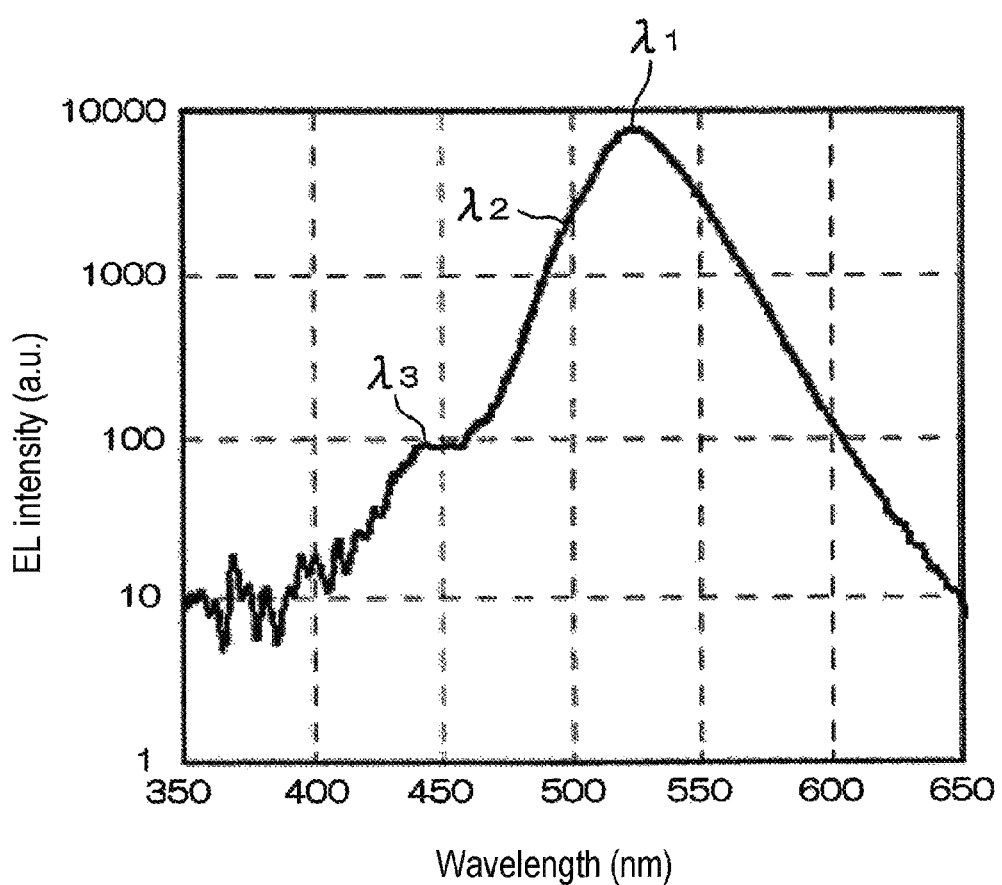

SEMICONDUCTOR LIGHT EMITTING DEVICE

CROSS-REFERENCE TO RELATED APPLICATION

This application is based upon and claims the benefit of priority from Japanese Patent Application No. 2015-101322, filed on May 18, 2015, the entire contents of which are incorporated herein by reference.

TECHNICAL FIELD

The present disclosure relates to a semiconductor light emitting device including an emission layer having a multiple quantum well structure.

BACKGROUND

In the related art, a semiconductor light emitting device is disclosed which includes a group III nitride semiconductor layer of a stacked structure having an n-type layer, a p-type layer, and an emission layer interposed between the n-type layer and the p-type layer. The emission layer has a multiple quantum well (MQW) structure in which an InGaN layer (quantum well layer) and a GaN layer (barrier layer) are alternately stacked over a predetermined period.

In the semiconductor light emitting device including an emission layer having an MQW structure in which a quantum well layer and a barrier layer are alternately stacked over a predetermined period, holes are injected from the p-type layer to the emission layer and electrons are injected from the n-type layer to the emission layer. The holes and the electrons are then recombined in each quantum well layer to generate light (hereinafter, the recombination in the quantum well layer will be referred to as "radiative recombination").

However, when each barrier layer is doped with an n-type impurity, holes and electrons may be recombined in the barrier layer (which includes non-radiative recombination that does not entail radiation) (hereinafter, the recombination in the barrier layer will be referred to as "non-radiative recombination"), so that the holes may be gradually consumed in a stage before reaching the quantum well layer. Thus, the radiative recombination in the quantum well layer is not sufficient, which may cause a failure in obtaining sufficient brightness and a desired peak emission wavelength.

SUMMARY

The present disclosure provides some embodiments of a semiconductor light emitting device capable of enhancing brightness and desirably obtaining a desired peak emission wavelength.

According to an embodiment of the present disclosure, there is provided a semiconductor light emitting device, including: an n-type layer; a p-type layer; and an emission layer is interposed between the n-type layer and the p-type layer. The emission layer has a multiple quantum well (MQW) structure in which barrier layers and quantum well layers are alternately stacked over a plurality of periods. In this configuration, n-type impurity concentrations of the barrier layers disposed up to a predetermined $\alpha$-th layer (where $\alpha$ is a natural number), when counting from the p-type layer, are smaller than an n-type impurity concentration of the barrier layer disposed at an $(\alpha+1)$-th layer, when counting from the p-type layer.

With this configuration, since the n-type impurity concentrations of the barrier layers disposed up to the $\alpha$-th layer are smaller than the n-type impurity concentration of the barrier layer disposed at the $(\alpha+1)$-th layer, the electron concentration of the barrier layers disposed up to the $\alpha$-th layer is reduced. Thus, it is possible to suppress the non-radiative recombination of holes and electrons in the barrier layers disposed up to the $\alpha$-th layer. In other words, since the hole consumption in the barrier layers disposed up to the $\alpha$-th layer can be suppressed, it is possible to suppress degradation of hole concentration in the barrier layers.

As a result, since the holes injected from the p-type layer can reach a layer close to the n-type layer, it is possible to increase the quantum well layer contributing to light emission. In particular, since the degradation of the hole concentration in the barrier layers up to the $\alpha$-th layer is suppressed, the radiative-recombination of holes and electrons can be desirably performed in the quantum well layers disposed up to at least the $\alpha$-th layer. As a result, it is possible to enhance brightness. Further, since the quantum well layers for obtaining an intended peak emission wavelength are disposed up to at least the $\alpha$-th layer, it is possible to desirably obtain a desired peak emission wavelength.

In the semiconductor light emitting device, the $\alpha$ may be a natural number of 2 or greater. In this case, the n-type impurity concentrations of a plurality of the barrier layers disposed at a first layer to the $\alpha$-th layer, when counting from the p-type layer, may be set to be the same.

In the semiconductor light emitting device, the quantum well layer may include $In_xGa_{1-x}N$. In this case, In (indium) composition ratios x of the quantum well layers disposed up to a predetermined $\beta$-th layer (where $\beta$ is a natural number) counting from the p-type layer may be greater than an In composition ratio x of the quantum well layer disposed at a $(\beta+1)$-th layer, when counting from the p-type layer.

Here, when light having a relatively long wavelength is intended to be emitted, it is believed that the above purpose can be achieved by forming the emission layer having an MQW structure in which the barrier layers and the quantum well layers having only relatively large In composition ratios x are alternately stacked over a plurality of periods.

However, the emission layer is formed on the n-type layer having a different (relatively small) lattice constant. Thus, when the emission layer including a plurality of quantum well layers having only relatively large In composition ratios x is formed on the n-type layer, a difference in lattice constant is increased to increase distortion of lattice in the emission layer. As a result, a lattice defect occurs due to lattice relaxation at a certain point of the emission layer. When the lattice defect occurs in the emission layer, intended brightness and peak emission wavelength may not be desirably obtained.

Thus, in this configuration, by disposing a quantum well layer having a relatively small In composition ratio x at the $(\beta+1)$-th layer, it is possible to suppress an increase in a difference of lattice constant between the n-type layer and the emission layer and to alleviate distortion of the emission layer. Thus, it is possible to suppress the occurrence of the lattice defect in the emission layer. Further, in this configuration, by arranging a relatively large quantum movement of the In composition ratio x up to the $\beta$-th layer, it is possible to emit light having a relatively long wavelength in the quantum well layer. In particular, by disposing a quantum well layer having a relatively large In composition ratio x up to the $\alpha$-th layer in which relatively high brightness can be realized, it is possible to desirably emit light having a relatively long wavelength.

In the semiconductor light emitting device, the β may be a natural number of 2 or greater. In this case, the In composition ratios x of a plurality of the quantum well layers disposed at the first layer to the β-th layer, when counting from the p-type layer, may be set to be the same.

With this configuration, since the In composition ratios x of the plurality of quantum well layers disposed at the first layer to the β-th layer are set to be the same, the peak emission wavelengths emitted from the first layer to the β-th layer can be the same. Thus, it is possible to increase brightness and peak emission wavelength in a portion where a range from the first layer to the α-th layer in which relatively high brightness can be realized and a range from the first layer to β-th layer in which the same peak emission wavelength is obtained overlap.

The β in the semiconductor light emitting device may be the α. In this configuration, the n-type impurity concentrations of the plurality of barrier layers disposed up to the α-th layer (the β-th layer) may be set to be the same, or may be set in an order in which they are increased in a stepwise manner toward the α-th layer (the β-th layer). In addition, in this case, the In composition ratios x of the plurality of the quantum well layers disposed up to the α-th layer (the β-th layer) may be set to be the same. With this configuration, a part in which relatively high brightness can be realized and a part in which the same peak emission wavelength is obtained can be matched. Thus, it is possible to effectively increase the brightness and peak emission wavelengths from the first layer to the α-th layer (the β-th layer).

In the semiconductor light emitting device, an In composition ratio x of the quantum well layer positioned at a certain γ-th layer (where γ is a natural number of 2 or greater), when counting from the p-type layer, may be the same as an In composition ratio x of the quantum well layer positioned at a (γ−1)-th layer, when counting from the p-type layer.

In the semiconductor light emitting device, an In composition ratio x of the quantum well layer positioned at a certain γ-th layer (where γ is a natural number of 2 or greater), when counting from the p-type layer, may be smaller than an In composition ratio x of the quantum well layer positioned at a (γ−1)-th layer, when counting from the p-type layer.

In the semiconductor light emitting device, an n-type impurity concentration of the barrier layer positioned at a certain δ-th layer (where δ is a natural number of 2 or greater), when counting from the p-type layer, may be the same as an n-type impurity concentration of the barrier layer positioned at a (δ−1)-th layer, when counting from the p-type layer.

In the semiconductor light emitting device, an n-type impurity concentration of the barrier layer positioned at a certain δ-th layer (where δ is a natural number of 2 or greater), when counting from the p-type layer, may be greater than an n-type impurity concentration of the barrier layer positioned at a (δ−1)-th layer, when counting from the p-type layer.

In the semiconductor light emitting device, the barrier layer may include GaN or InGaN.

In the semiconductor light emitting device, the barrier layer may be doped with silicon as an n-type impurity.

The semiconductor light emitting device may further include an intermediate layer interposed between the emission layer and the n-type layer and having a stacked structure in which a first layer including $In_yGa_{1-y}N$ and a second layer including GaN are alternately stacked over a plurality of periods.

In the semiconductor light emitting device, an In composition ratio y of the first layer may range from 0.005 to 0.1. In the semiconductor light emitting device, the first layer may have a thickness ranging from 0.5 nm to 10 nm. In the semiconductor light emitting device, the second layer may have a thickness ranging from 3 nm to 50 nm.

In the semiconductor light emitting device, the quantum well layer may have a thickness ranging from 2.5 nm to 3.5 nm. In the semiconductor light emitting device, the barrier layer may have a thickness ranging from 1 nm to 20 nm. In the semiconductor light emitting device, the n-type impurity concentration of the barrier layer may range from 0 $cm^{-3}$ to $3 \times 10^{18}$ $cm^{-3}$. When the n-type impurity concentration of the barrier layer is 0 $cm^{-3}$, it specifically means that it is undoped (impurity is not included).

In the semiconductor light emitting device, the In composition ratio x of the quantum well layer may range from 0.05 to 0.25. In the semiconductor light emitting device, the emission layer may emit light having a peak light emitting wavelength within a range from 420 nm to 560 nm.

According to another embodiment of the present disclosure, there is provided a semiconductor light emitting device, including: an n-type layer; a p-type layer; and an emission layer interposed between the n-type layer and the p-type layer. The emission layer has a multiple quantum well (MQW) structure in which barrier layers having an n-type impurity concentration of 0 $cm^{-3}$ or more and less than $7 \times 10^{17}$ $cm^{-3}$, and quantum well layers including are alternately stacked over a plurality of periods. In this configuration, a plurality of the quantum well layers may be disposed in an order in which the In composition ratios x thereof are decreased in a stepwise manner toward the n-type layer from the p-type layer.

With this configuration, since the plurality of barrier layers are set to have the n-type impurity concentration of 0 $cm^{-3}$ or more and less than $7 \times 10^{17}$ $cm^{-3}$, an electron concentration of the barrier layers can be effectively reduced. Thus, since the non-radiative recombination of holes and electrons can be suppressed, the holes injected from the p-type layer can be widely spread up to the vicinity of the n-type layer. As a result, since the electrons and holes can be desirably recombined even in the quantum well layer disposed in a position close to the n-type layer, it is possible to effectively enhance brightness.

Further, with this configuration, the plurality of quantum well layers are disposed in order in which the In composition ratios x are decreased in a stepwise manner toward the n-type layer from the p-type layer. Thus, the lattice constant is suppressed from varying rapidly between the n-type layer and the emission layer, thereby alleviating distortion of the emission layer. As a result, it is possible to suppress the occurrence of the lattice defect in the emission layer, thereby obtaining desired brightness and peak emission wavelength. In this configuration, since the plurality of quantum well layers are disposed to have different In composition ratios x, it is possible to desirably emit light having a plurality of peak emission wavelengths.

In the semiconductor light emitting device, a plurality of the barrier layers may be set to have the same n-type impurity concentration. In the semiconductor light emitting device, a plurality of the barrier layers may be disposed in an order in which the n-type impurity concentrations thereof are increased in a stepwise manner toward the n-type layer from the p-type layer.

In the semiconductor light emitting device, when a forward voltage is applied to the n-type layer and the p-type layer, the emission layer may emit light having a peak emission wavelength corresponding to the In composition ratio x of the quantum well layer positioned at the lowermost layer of the multiple quantum well layer.

BRIEF DESCRIPTION OF THE DRAWINGS

FIG. 4 is a waveform view illustrating an electro luminescence (EL) spectrum of the semiconductor light emitting device illustrated in FIG. 1.

DETAILED DESCRIPTION

Embodiments of the present disclosure will be now described in detail with reference to the drawings.

First Embodiment

Figure 1:
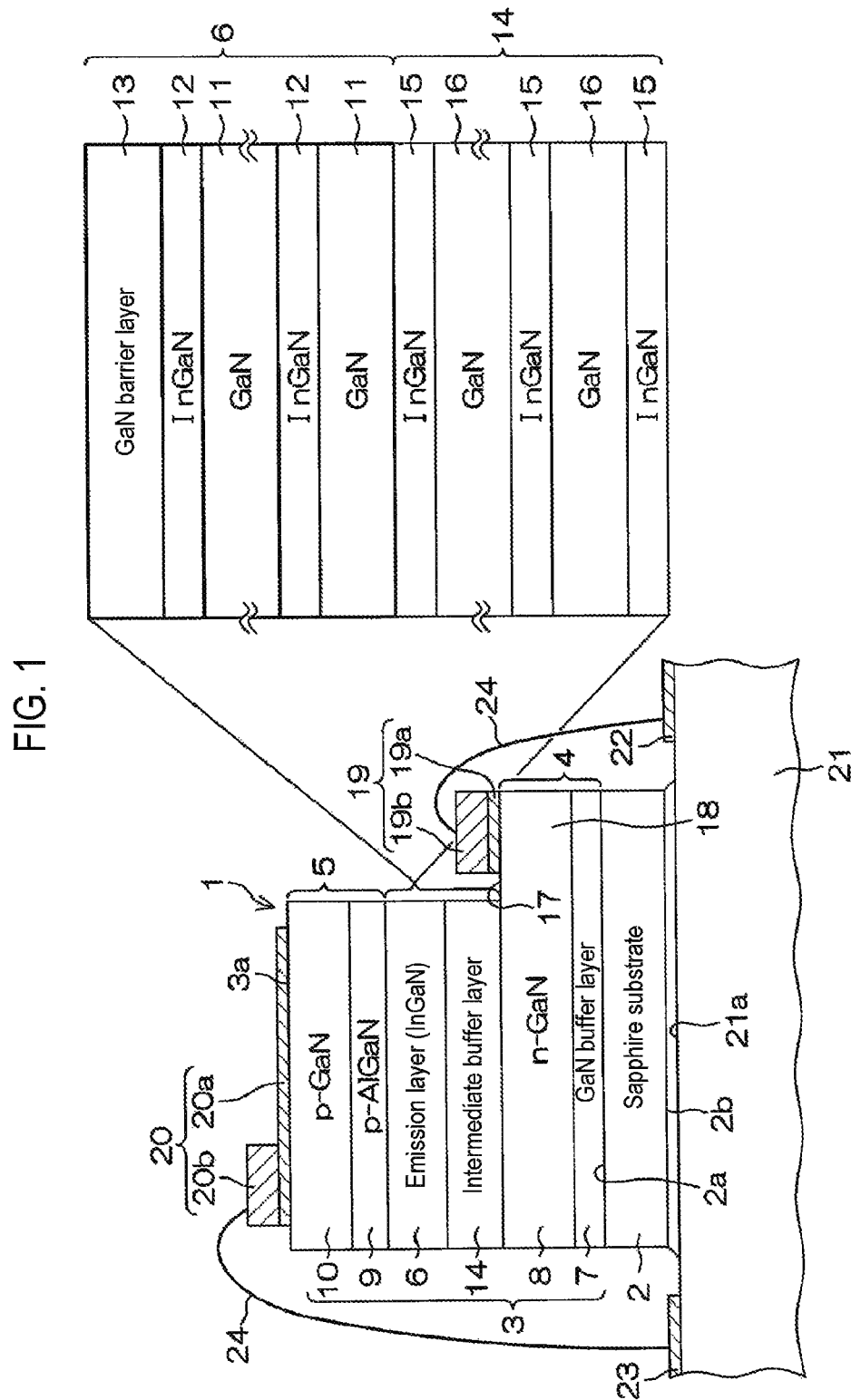
FIG. 1 is a schematic cross-sectional view illustrating a structure of a semiconductor light emitting device according to a first embodiment of the present disclosure.

FIG. 1 is a schematic cross-sectional view illustrating a structure of a semiconductor light emitting device 1 according to a first embodiment of the present disclosure.

The semiconductor light emitting device 1 is, for example, a light emitting diode (LED). The semiconductor light emitting device 1 includes a substrate 2 and a group III nitride semiconductor layer 3 forming a group III nitride semiconductor stacked structure formed on the substrate 2. The substrate 2 is, for example, a sapphire single crystal substrate in which a polar plane (c-plane in this embodiment) is a main plane 2a. Hereinafter, the main plane 2a of the substrate 2 will be referred to as a "surface 2a", and a main plane on the opposite side thereof will be referred to as a "rear surface 2b".

The surface 2a of the substrate 2 is a plane having an OFF angle of 0.2° or greater from a plane orientation of the polar plane and, more preferably, an OFF angle of 0.2° or greater in an m-axis direction. Thus, a growth main surface (surface 3a) of the group III nitride semiconductor layer 3 crystal-grown on the substrate 2 is the same plane as the surface 2a of the substrate 2, i.e., the polar plane (c-plane in this embodiment). In some embodiments, a thickness of the substrate 2 may be 600 μm or greater and, specifically, range from 650 μm to 1000 μm. The substrate 2 may be a hexagonal system substrate such as a GaN substrate, a ZnO substrate, an MN substrate, or an SiC substrate, instead of the sapphire single crystal substrate.

The group III nitride semiconductor layer includes an n-type layer 4 formed on the substrate 2, a p-type layer 5 formed on the n-type layer, and an emission layer 6 interposed between the n-type layer 4 and the p-type layer 5. The n-type layer 4 includes a GaN buffer layer 7 and an n-type GaN contact layer 8 formed on the GaN buffer layer 7. The GaN buffer layer 7 is formed of an undoped (impurity-free) GaN layer. The GaN buffer layer 7 may have a thickness raging from, for example, 5 nm to 50 nm.

The n-type GaN contact layer 8 is formed of, for example, an n-type GaN layer doped with silicon as an n-type impurity. An n-type impurity concentration of the n-type GaN contact layer 8 may be, for example, about $1 \times 10^{18}$ cm$^{-3}$. The n-type GaN contact layer 8 may have a thickness ranging from, for example, 3 μm to 7 μm. In addition, an undoped (impurity-free) GaN layer may be further interposed between the GaN buffer layer 7 and the n-type GaN contact layer 8.

The p-type layer 5 includes a p-type AlGaN electron blocking layer 9 and a p-type GaN contact layer 10 formed on the p-type AlGaN electron blocking layer 9. The p-type AlGaN electron blocking layer 9 is formed of, for example, an AlGaN layer doped with magnesium as a p-type impurity. A p-type impurity concentration of the p-type AlGaN electron blocking layer 9 may be, for example, about $3 \times 10^{19}$ cm$^{-3}$. The P-type AlGaN electron blocking layer 9 may have a thickness ranging from, for example, 5 nm to 30 nm.

The p-type GaN contact layer 10 is formed of, for example, a GaN layer doped with magnesium as a p-type impurity. The p-type GaN contact layer 10 has a p-type impurity concentration greater than the p-type impurity concentration of the p-type AlGaN electron blocking layer 9. The p-type impurity concentration of the p-type GaN contact layer 10 may be, for example, about $1 \times 10^{20}$ cm$^{-3}$. The p-type GaN contact layer 10 may have a thickness ranging from, for example, 0.1 μm to 0.5 μm. The surface 3a of the p-type GaN contact layer 10 is polished and forms the outermost surface 3a of the group III nitride semiconductor layer 3.

The emission layer 6 has a multiple quantum well (MQW) structure in which the barrier layers 11 and the quantum well layers 12 are alternately stacked over a plurality of periods. The barrier layer 11 includes GaN or InGaN. In this embodiment, an example in which the barrier layer 11 is formed of GaN is illustrated. The quantum well layer 12 includes $In_xGa_{1-x}N$. The emission layer 6 further includes a GaN barrier layer 13 interposed between the MQW structure and the p-type layer 5. A specific configuration of the emission layer 6 will be described below with reference to FIG. 2.

The group III nitride semiconductor layer 3 further includes an intermediate buffer layer 14 as an example of an intermediate layer of the present disclosure interposed between the n-type layer 4 and the emission layer 6. The intermediate buffer layer 14 has a stacked structure in which first layers 15 including $In_yGa_{1-y}N$ and second layers 16 including GaN are alternately stacked over a plurality of periods. In this embodiment, the first layers 15 and the second layers 16 are alternately stacked over four periods (i.e., four pairs).

The plurality of first layers 15 are formed to have an In composition ratio y ranging from, for example, 0.005 to 0.1 (more specifically, ranging from 0.01 to 0.06). In this embodiment, the plurality of first layers 15 are disposed in an order in which the In composition ratio y is increased in a stepwise manner toward the emission layer 6. The first layer 15 may have a thickness ranging from, for example, 0.5 nm to 10 nm (more specifically, ranging from 7 nm to 8 nm). Meanwhile, the second layer 16 includes undoped (impurity-free) GaN. The second layer 16 may have a slight amount of In within a range smaller than the In composition ratio y of the first layer 15. The second layer 16 is formed to be thicker than the first layer 15. The second layer 16 may have a thickness ranging from, for example, 3 nm to 50 nm (more specifically, ranging from 3 nm to 30 nm).

A concave portion 17 configured to selectively expose the n-type GaN contact layer 8 is formed in the group III nitride semiconductor layer 3. The concave portion 17 is formed by selectively removing (for example, etching) the intermediate buffer layer 14, the emission layer 6, the p-type AlGaN electron blocking layer 9, and the p-type GaN contact layer 10. The n-type GaN contact layer 8 exposed from the concave portion 17 forms a lead-out portion 18 led out in a traverse direction along the surface 2a of the substrate 2 from one side of the group III nitride semiconductor layer 3.

The semiconductor light emitting device 1 further includes an n-type electrode (cathode electrode) 19 electrically connected to the n-type layer 4 and a p-type electrode (anode electrode) 20 electrically connected to the p-type layer 5.

The n-type electrode 19 is disposed on the lead-out portion 18 of the n-type GaN contact layer 8. More specifically, the n-type electrode 19 includes a first transparent electrode 19a formed on the lead-out portion 18 and a first upper electrode 19b formed on the first transparent electrode 19a. The first transparent electrode 19a may be formed on substantially the entire region of the lead-out portion 18.

The p-type electrode 20 is disposed on the p-type GaN contact layer 10. More specifically, the p-type electrode 20 includes a second transparent electrode 20a formed on the p-type GaN contact layer 10 and a second upper electrode 20b formed on the second transparent electrode 20a. The second transparent electrode 20a may be formed on substantially the entire region of the p-type GaN contact layer 10.

In this embodiment, the first transparent electrode 19a and the second transparent electrode 20a have the same thickness and are formed of the same metal material. The first transparent electrode 19a and the second transparent electrode 20a may include one or a plurality of metal materials selected from the group including, for example, ZnO, ITO, and Ni. Further, in this embodiment, the first upper electrode 19b and the second upper electrode 20b have the same thickness and are formed of the same metal material. The first upper electrode 19b and the second upper electrode 20b may include one or a plurality of metal materials selected from the group including, for example, TiN, Cr, Pt, Ti, Al, Au, and an AuSn alloy. The first upper electrode 19b and the second upper electrode 20b may be a stacked film including, for example, a Cr film and an Au film formed on the Cr film.

In the semiconductor light emitting device 1, the substrate 2 is bonded to a bonding surface 21a of a support substrate 21 so as to be supported by the corresponding support substrate 21. A first wiring 22 and a second wiring 23 are formed on the bonding surface 21a of the support substrate 21. The first wiring 22 is electrically connected to the n-type electrode 19 through a bonding wire 24. The second wiring 23 is electrically connected to the p-type electrode 20 through a bonding wire 24.

In this configuration, the semiconductor light emitting device 1 and at least the surface of the support substrate 21 are sealed by a transparent resin (not shown) such as an epoxy resin. In this manner, the package (diode package) of the semiconductor light emitting device 1 is formed. Light generated by the emission layer 6 is extracted from the outermost surface 3a of the group III nitride semiconductor layer 3 or the rear surface 2b of the substrate 2. In this embodiment, an example in which the outermost surface 3a of the group III nitride semiconductor layer 3, that is, the surface on which the n-type electrode 19 is formed is a light extraction surface is illustrated.

Figure 2:
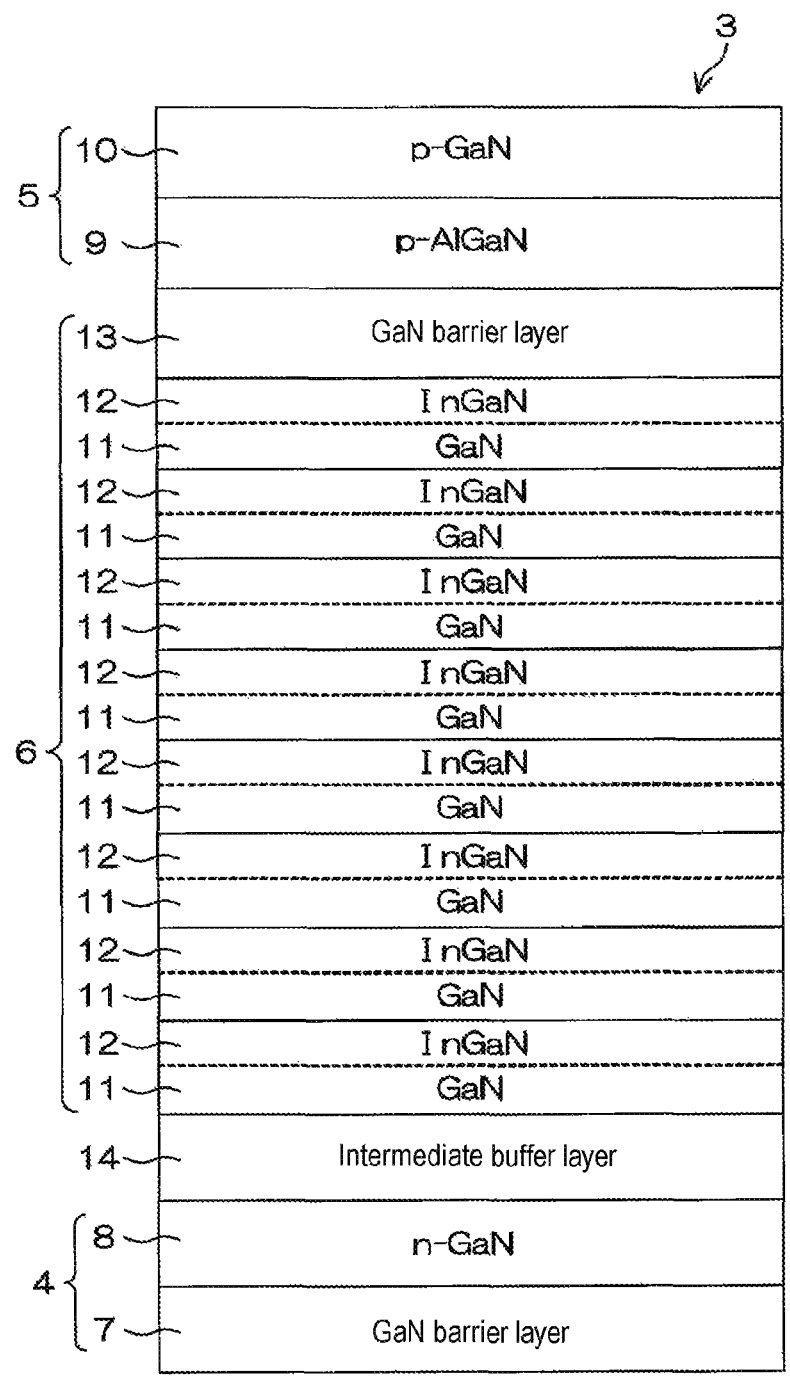
FIG. 2 is a view illustrating a specific configuration of an emission layer illustrated in FIG. 1.

FIG. 2 is a view illustrating a specific configuration of the emission layer 6 illustrated in FIG. 1. In this embodiment, a case in which the emission layer 6 has an MQW structure in which the barrier layers 11 and the quantum well layers 12 are alternately stacked over eight periods (i.e., eight pairs) will be described as an example.

The emission layer 6 includes the barrier layers 11 doped with silicon as an n-type impurity. An n-type impurity concentration of each of the barrier layers 11 may range from, for example, 0 cm$^{-3}$ to 3×10$^{18}$ cm$^{-3}$. When the n-type impurity concentration of the barrier layer 11 is 0 cm$^{-3}$, it specifically means that it is undoped (impurity is not included). Each of the barrier layers 11 may have a thickness ranging from, for example, 1 nm to 20 nm (more specifically, ranging from 3.5 nm to 20 nm). Further, the barrier layer 11 may include a slight amount of In within a range smaller than the In composition ratio x of the quantum well layer 12. In other words, the barrier layer 11 may also have an In composition ratio as z≈0 in In$_z$Ga$_{1-z}$N.

An In composition ratio x of each of the quantum well layers 12 ranges from, for example, 0.05 to 0.25 (more specifically, ranges from 0.1 to 0.23). Each of the quantum well layers 12 may have a thickness ranging from, for example, 2.5 nm to 3.5 nm (more specifically, ranging from 2.7 nm to 3.3 nm). Further, the thickness of the barrier layer 11 and the thickness of the quantum well layer 12 are not limited thereto, and the barrier layers 11 and the quantum well layers 12 may have a uniform thickness with respect to each other or may have a thickness varied in a stacking direction of the group III nitride semiconductor layer 3. In this embodiment, the thicknesses of the barrier layers 11 and the quantum well layers 12 are substantially uniform in the corresponding stacking direction.

The GaN barrier layer 13 forms the barrier layer positioned at the uppermost layer of the emission layer 6. The GaN barrier layer 13 may be, for example, an undoped (impurity-free) GaN layer. The GaN barrier layer 13 may have a thickness of, for example, about 10 nm.

Figure 3A:
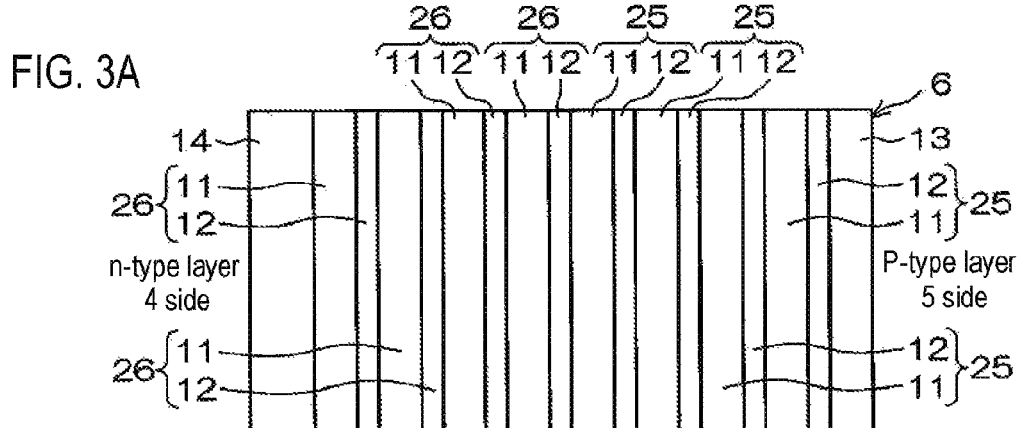
FIG. 3A is a view illustrating the emission layer of FIG. 1.
Figure 3B:
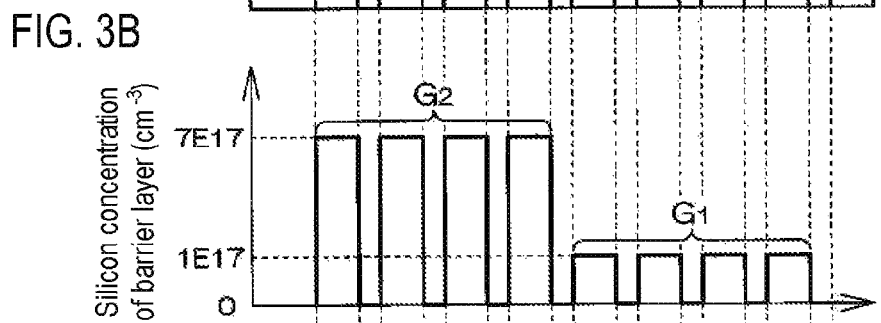
FIG. 3B is a view illustrating a silicon concentration of a barrier layer.
Figure 3C:
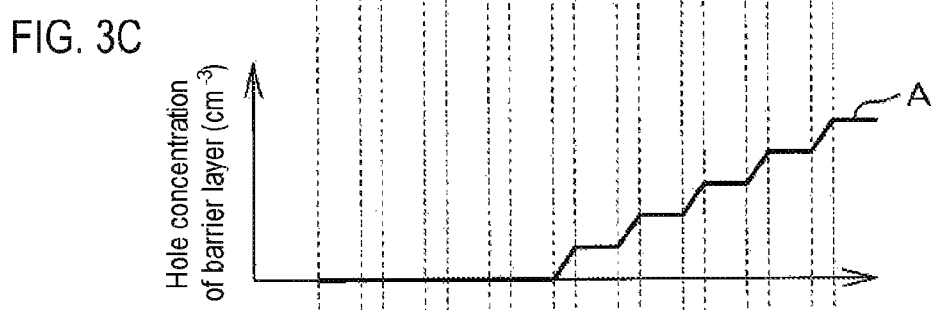
FIG. 3C is a view illustrating a hole concentration of the emission layer.
Figure 3D:
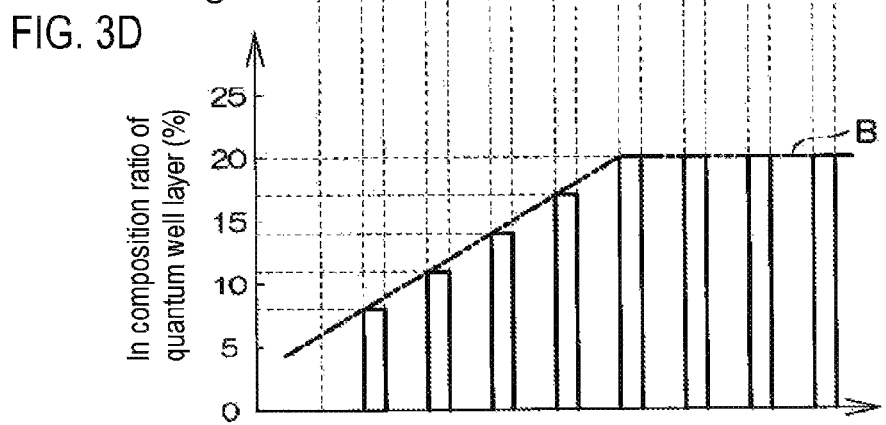
FIG. 3D is a view illustrating an indium (In) composition ratio of a quantum well layer.

FIG. 3A is a view illustrating the emission layer 6. FIG. 3B is a view illustrating a silicon concentration of the barrier layer 11. FIG. 3C is a view illustrating a hole concentration of the emission layer 6. FIG. 3D is a view illustrating an In composition ratio x of the quantum well layer 12. In FIG. 3C, a hole concentration is represented by the broken line A. In FIG. 3D, in addition to the graph of the In composition ratio x, the In composition ratio x of the quantum well layer 12 of the emission layer 6 in a depth direction oriented from the p-type layer 5 to the n-type layer 4 is represented by the two-dot chain line B.

Referring to FIGS. 3A and 3B, in this embodiment, the plurality of barrier layers 11 are formed to have the same or a plurality of different n-type impurity concentrations. More specifically, the plurality of barrier layers 11 form a plurality of groups, in which at least one barrier layer 11 belongs to each group. At least one barrier layer 11 having one n-type impurity concentration belongs to each group. Thus, the plurality of groups have different n-type impurity concentrations respectively. In this case, the plurality of groups may be disposed in an order in which a group having the smallest n-type impurity concentration is disposed in the p-type layer 5 side and the n-type impurity concentrations are increased in a stepwise manner from the p-type layer 5 toward the n-type layer 4. The group closest to the p-type layer 5 may include at least one undoped (impurity-free) barrier layer 11.

Further, one or a plurality of groups having a relatively small n-type impurity concentration are disposed in the p-type layer 5 side and one or a plurality of groups having a relatively large n-type impurity concentration may be disposed in the n-type layer 4 side. In this case, one or a plurality of groups having an n-type impurity concentration greater or smaller than the n-type impurity concentration of the group disposed in the p-type layer 5 side and having the relatively large n-type impurity concentration and that of the group disposed in the n-type layer 4 side and having the relatively small n-type impurity concentration may be interposed therebetween.

A configuration in which the plurality of barrier layers 11 form a first group $G_1$ disposed in the p-type layer 5 side and having a relatively small n-type impurity concentration and a second group $G_2$ disposed in the n-type layer 4 side and having a relatively large n-type impurity concentration will be now described as an example.

As illustrated in FIG. 3B, four barrier layers 11 positioned at first to fourth layers, when counting from the p-type layer 5, belong to the first group $G_1$. Meanwhile, four barrier layers 11 positioned at fifth to eighth layers, when counting from the p-type layer 5, belong to the second group $G_2$. The n-type impurity concentrations of the four barrier layers 11 belonging to the first group $G_1$ are all $1\times10^{17}$ cm$^{-3}$, and the n-type impurity concentrations of the four barrier layers 11 belonging to the second group $G_2$ are all $7\times10^{17}$ cm$^{-3}$.

The above may be summarized as follows. In other words, the n-type impurity concentrations of the plurality of barrier layers 11 disposed up to a predetermined α-th layer (where α is a natural number and the fourth layer in this embodiment), when counting from the p-type layer 5, are set to be smaller than the n-type impurity concentration of the barrier layer 11 disposed at an (α+1)-th layer (the fifth layer in this embodiment), when counting from the p-type layer 5. Further, the n-type impurity concentrations of the plurality of barrier layers 11 disposed at the first layer to the α-th layer are set to be the same.

Further, the n-type impurity concentrations of the plurality of barrier layers 11 formed on the (α+1)-th layer to the lowermost layer (the eighth layer in this embodiment) are set to be the same. Further, the n-type impurity concentration of the barrier layer 11 positioned at a certain δ-th layer (where δ is a natural number of 2 or greater) is the same as or greater than the n-type impurity concentration of the barrier layer 11 positioned at a (δ−1)-th layer, when counting from the p-type layer 5.

Further, the plurality of barrier layers 11 disposed up to the α-th layer may be disposed in an order in which a predetermined n-type impurity concentration is increased in a stepwise manner in a direction toward the α-th layer within a predetermined range (for example, 0 cm$^{-3}$ or more and less than $7\times10^{17}$ cm$^{-3}$) of the corresponding n-type impurity concentration. Further, the plurality of barrier layers 11 disposed up to the α-th layer may be disposed in random order such as 0 cm$^{-3}$→$1\times10^{17}$ cm$^{-3}$→$5\times10^{17}$ cm$^{-3}$→$3\times10^{17}$ cm$^{-3}$ sequentially from the first layer within the predetermined range (for example, 0 cm$^{-3}$ or more and less than $7\times10^{17}$ cm$^{-3}$) of the n-type impurity concentration.

Further, the plurality of barrier layers 11 disposed at the (α+1)-th layer to the lowermost layer may be disposed in an order in which a predetermined n-type impurity concentration is increased in a stepwise manner toward the lowermost layer within a predetermined range (for example, from $7\times10^{17}$ cm$^{-3}$ to $3\times10^{18}$ cm$^{-3}$) of the n-type impurity concentration. Further, the plurality of barrier layers 11 disposed at the (α+1)-th layer to the lowermost layer may be disposed in random order such as $1\times10^{18}$ cm$^{-3}$→$7\times10^{17}$ cm$^{-3}$→$3\times10^{18}$ cm$^{-3}$→$2\times10^{18}$ cm$^{-3}$ sequentially from the (α+1)-th layer within the predetermined range (for example, from $7\times10^{17}$ cm$^{-3}$ to $3\times10^{18}$ cm$^{-3}$) of the n-type impurity concentration.

As represented by the broken line A of FIG. 3C, a hole concentration is gradually decreased toward the n-type layer 4. The hole concentration is mainly decreased in the quantum well layers 12, and rarely decreased in the barrier layers 11. This is because the holes and electrons are recombined in the quantum well layers 12 to generate light (hereinafter, the recombination in the quantum well layers 12 will be referred to as "radiative recombination"), so the holes are consumed as the light is generated.

Meanwhile, since the plurality of barrier layers 11 disposed at the first to fourth layers have the n-type impurity concentration set to be relatively small, the electron concentration is reduced. Thus, the electron-hole recombination (including non-radiative recombination that does not entail radiation; hereinafter, the recombination in the barrier layers 11 will be referred to as "non-radiative recombination") is suppressed. Accordingly, the consumption of holes in the barrier layers 11 disposed up to the fourth layer is suppressed. In this embodiment, the n-type impurity concentrations of the plurality of barrier layers 11 are adjusted such that the hole concentration is very small in the fifth layer.

Referring to FIGS. 3A and 3D, in this embodiment, the plurality of quantum well layers 12 are formed to have the same or a plurality of different In composition ratios x. The plurality of quantum well layers 12 are disposed in an order in which the In composition ratios x thereof are decreased in a stepwise manner from the p-type layer 5 toward the n-type layer 4. In other words, as represented by the broken line B of FIG. 3D, the plurality of quantum well layers 12 are disposed such that the In composition ratios x are gradually decreased from the p-type layer 5 toward the n-type layer 4 in a depth direction of the emission layer 6.

In this embodiment, the In composition ratios x of the plurality of quantum well layers 12 disposed at the first to fourth layers are set to range from 0.19 (19%) to 0.23 (23%). In this embodiment, the In composition ratios x of the plurality of quantum well layers 12 disposed at the first to fourth layers are set to be the same and the In composition ratio x is 0.20 (20%).

The In composition ratios x of the plurality of quantum well layers 12 disposed at the fifth to eighth layers are set to be decreased in a stepwise manner toward the n-type layer 4. The In composition ratios x of the plurality of quantum well layers 12 disposed at the fifth to eighth layers may be 0.08 (8%) or more and less than 0.19 (19%) in some embodiments, and may range from 0.1 (10%) to 0.18 (18%) in some embodiments. The In composition ratios x of the plurality of quantum well layers 12 disposed at the fifth to eighth layers are 0.17 (17%), 0.14 (14%), 0.11 (11%), 0.08 (8%), respectively, sequentially from the fifth layer in this embodiment. In other words, the In composition ratios x of the quantum well layers 12 after the fifth layer are set to be decreased by 0.03 (3%) each time from the In composition ratio x (=0.20) of the fourth layer. The In composition ratios x of the quantum well layers 12 after the fifth layer are different by at least 0.03 (3%) or greater with respect to the In composition ratios x of the quantum well layers 12 disposed up to the fourth layer.

The above may be summarized as follows. In other words, as illustrated in FIG. 3D, the In composition ratios x of the plurality of quantum well layers 12 disposed up to a predetermined β-th layer (where β is a natural number and the fourth layer in this embodiment), when counting from the p-type layer 5, is greater than the In composition ratio x of the quantum well layer 12 disposed at a (β+1)-th layer (the fifth layer in this embodiment). In this embodiment, "β" is "α". Further, the In composition ratios x of the plurality of quantum well layers 12 disposed up to the β-th layer are set to be the same.

The In composition ratios x of the quantum well layers 12 disposed at the ((β+1)-th layer to eighth layer are set to be decreased in a stepwise manner toward the n-type layer 4. Further, an In composition ratio x of the quantum well layer 12 positioned at a certain γ-th layer (where α is a natural number of 2 or greater), when counting from the p-type layer 5, is the same as or smaller than an In composition ratio x of the quantum well layer 12 positioned at a (γ−1)-th layer, when counting from the p-type layer 5.

In this embodiment, the plurality of quantum well layers 12 disposed at the first to fourth layers form green emission layers 25 for emitting light having a peak emission wavelength ranging from 500 nm to 550 nm between the plurality of the quantum well layers 12 and the corresponding barrier layers 11. Meanwhile, the plurality of quantum well layers 12 disposed at the fifth to eighth layers form blue emission layers 26 for emitting light having a peak emission wavelength of 380 nm or more and less than 500 nm between the plurality of quantum well layers 12 and the corresponding barrier layers 11.

FIG. 4 is a waveform view illustrating an electro luminescence (EL) spectrum of the semiconductor light emitting device illustrated in FIG. 1.

In this embodiment, EL intensity was measured using a diode package in which the semiconductor light emitting device 1 is sealed by a transparent resin. In the diode package, the semiconductor light emitting device 1 is disposed on the support substrate 21. The n-type electrode 19 of the semiconductor light emitting device 1 is electrically connected to the first wiring 22 through the bonding wire 24. The p-type electrode 20 of the semiconductor light emitting device 1 is electrically connected to the second wiring 23 through the bonding wire 24. The EL intensity is an integrated value obtained by performing EL measurement of the diode package by applying a predetermined forward voltage $V_f$ to the n-type electrode 19 (second wiring 23) and the p-type electrode 20 (first wiring 22), calculating a spectrum distribution, and integrating an emission wavelength of a spectrum ranging from 350 nm to 650 nm.

As illustrated in FIG. 4, a first peak emission wavelength $\lambda_1$ is present within a range from 500 nm to 550 nm. Further, a second peak emission wavelength $\lambda_2$ is present within a range of 470 nm or more and less than 500 nm. Further, a third peak emission wavelength $\lambda_3$ is present within a range of 420 nm or more and less than 470 nm Waveforms less than 420 nm are noise. Among the first to third peak emission wavelengths $\lambda_1$ to $\lambda_3$, the first peak emission wavelength $\lambda_1$ has the largest value.

The first peak emission wavelength $\lambda_1$ includes a peak emission wavelength corresponding to the In composition ratios x (=0.2) of the plurality of quantum well layers 12 disposed at the first layer to α-th layer (fourth layer). The second peak emission wavelength $\lambda_2$ includes a peak emission wavelength corresponding to the In composition ratios x (=0.17) of the quantum well layer 12 disposed at the fifth layer. The third peak emission wavelength $\lambda_3$ includes a peak emission wavelength corresponding to the In composition ratios x (=0.14) of the plurality of quantum well layers 12 disposed at the sixth layer.

The EL intensity of the third peak emission wavelength $\lambda_3$ is about one-hundredth of the EL intensity of the first peak emission wavelength $\lambda_1$. It is not possible to confirm a peak emission wavelength (400 nm or more and less than 420 nm) corresponding to the quantum well layer 12 positioned at the seventh layer and a peak emission wavelength (380 nm or more and less than 400 nm) corresponding to the quantum well layer 12 positioned at the eighth layer. Therefore, it is understood that the green emission layer 25 contributes to light emission, whereas the blue emission layer 26 rarely does.

As described above, according to this embodiment, referring to FIGS. 3A to 3D, the n-type impurity concentrations of the plurality of barrier layers 11 disposed at the first layer to α-th layer (fourth layer) are smaller than the n-type impurity concentrations of the plurality of barrier layers 11 disposed at the (α+1)-th layer (fifth layer) to the lowermost layer (eighth layer). Further, the n-type impurity concentrations of the plurality of barrier layers 11 disposed at the first layer to α-th layer (fourth layer) are set to be the same.

In this manner, the electron concentrations of the plurality of barrier layers 11 disposed at the first layer to α-th layer (fourth layer) are reduced. Thus, it is possible to suppress the non-radiative recombination of holes and electrons in the barrier layers 11 disposed up to the α-th layer (fourth layer). In other words, since the hole consumption in the barrier layers 11 disposed up to the α-th layer (fourth layer) can be suppressed, it is possible to suppress degradation of hole concentration.

As a result, since the holes injected from the p-type layer 5 can reach a layer close to the n-type layer 4, it is possible to increase the quantum well layer 12 contributing to light emission. In particular, since the degradation of the hole concentration in the barrier layers 11 up to the α-th layer (fourth layer) is suppressed, the radiative-recombination of holes and electrons can be desirably performed in the quantum well layers 12 disposed up to at least the α-th layer (fourth layer). As a result, it is possible to enhance brightness. Further, since the quantum well layers 12 for obtaining an intended peak emission wavelength are disposed up to at least the α-th layer (fourth layer), it is possible to desirably obtain a desired peak emission wavelength.

Here, a case in which light having a relatively long wavelength (for example, light having a peak emission wavelength ranging from 500 nm to 550 nm) is intended to be emitted will be considered. In this case, it is believed that the above purpose can be achieved by forming the emission layer 6 having an MQW structure in which the barrier layers 11 and the quantum well layers 12 having only relatively large In composition ratios x are alternately stacked over a plurality of periods.

However, the emission layer 6 is formed on the n-type layer 4 having a different (relatively small) lattice constant. Thus, when the emission layer including a plurality of quantum well layers 12 having only relatively large In composition ratios x is formed on the n-type layer 4, a difference in lattice constant is increased to increase distortion of lattice in the emission layer 6. As a result, a lattice defect occurs due to lattice relaxation at a certain point of the emission layer 6. When the lattice defect occurs in the emission layer 6, intended brightness and peak emission wavelength may not be desirably obtained.

Thus, in this embodiment, the quantum well layer 12 having a relatively small In composition ratio x is disposed at the (($\beta$+1)-th layer (fifth layer) to the lowermost layer (eighth layer). More specifically, the plurality of quantum well layers 12 are disposed in an order in which the In composition ratios x thereof are decreased stepwise in a direction toward the n-type layer 4 from the (($\beta$+1)-th layer (fifth layer) to the lowermost layer (eighth layer). In addition, in this embodiment, the intermediate buffer layer 14 is interposed between the n-type layer 4 and the emission layer 6.

In the intermediate buffer layer 14, a plurality of first layers 15 including $In_yGa_{1-y}N$ are disposed in an order in which the In composition ratios y thereof are decreased in a stepwise manner toward the n-type layer 4 from the emission layer 6. The In composition ratio y of the first layer 15 of the intermediate buffer layer 14 is smaller than the In composition ratio x of the quantum well layer 12 of the emission layer 6. In this manner, a rapid fluctuation in the lattice constant between the n-type layer 4 and the emission layer 6 can be suppressed. As a result, it is possible to effectively suppress the occurrence of a lattice defect in the emission layer 6.

Further, in this embodiment, the n-type impurity concentrations of the plurality of barrier layers 11 disposed at the first layer to $\alpha$-th layer (fourth layer) are set to be the same, and also, the In composition ratios x of the plurality of quantum well layers 12 disposed at the first layer to $\beta$-th layer (fourth layer) are set to be the same. Thus, a part in which relatively high brightness can be realized and a part in which the same emission wavelength is obtained can be matched. As a result, it is possible to effectively increase the brightness and peak emission wavelengths from the first layer to $\alpha$-th layer (fourth layer). In this embodiment, since the green emission layers 25 are disposed at the first to fourth layers (see FIG. 3A), the green emission layers 25 can desirably emit a green light having the first peak emission wavelength $\lambda_1$ ranging from 500 nm to 550 nm (see FIG. 4).

Further, in this embodiment, the n-type electrode 19 including the first transparent electrode 19a and the first upper electrode 19b is formed on the n-type GaN contact layer 8 (the lead-out portion 18), and the p-type electrode 20 including the second transparent electrode 20a and the second upper electrode 20b is formed on the p-type GaN contact layer 10. In this configuration, the first transparent electrode 19a and the second transparent electrode 20a are formed to have the same thickness and formed of the same material, and the first upper electrode 19b and the second upper electrode 20b are formed to have the same thickness and formed of the same material. With this configuration, since the n-type electrode 19 and the p-type electrode 20 can be simultaneously formed, it is possible to simplify a manufacturing process.

Second Embodiment

Figure 5:
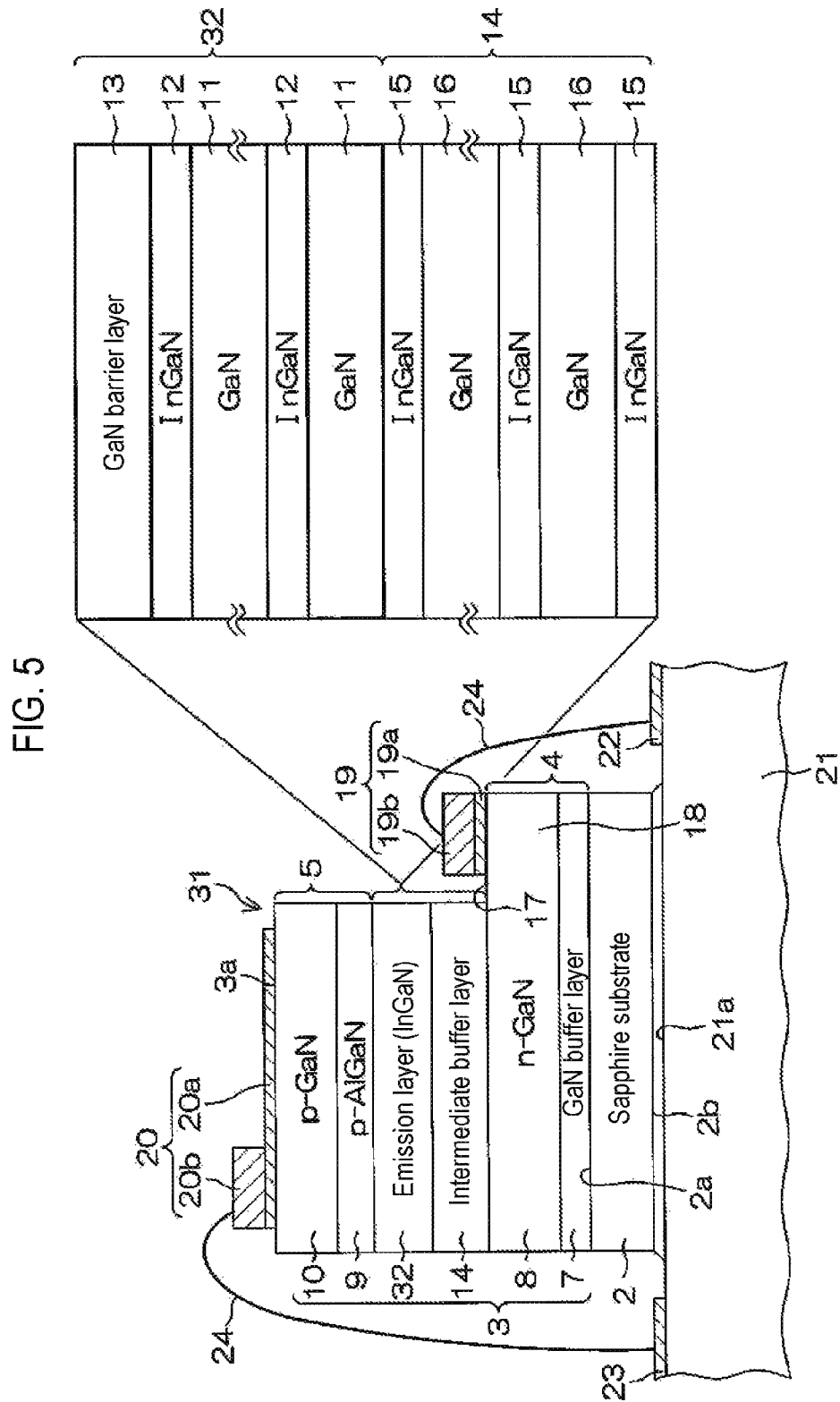
FIG. 5 is a schematic cross-sectional view illustrating a structure of a semiconductor light emitting device according to a second embodiment of the present disclosure.

FIG. 5 is a schematic cross-sectional view illustrating a structure of a semiconductor light emitting device 31 according to a second embodiment of the present disclosure. The semiconductor light emitting device 31 is different from the foregoing semiconductor light emitting device 1, in that a group III nitride semiconductor layer 3 includes an emission layer 32 instead of the emission layer 6, but other components thereof are the same as those of the semiconductor light emitting device 1. In FIG. 5, the same reference numerals will be given to parts thereof corresponding to the parts illustrated in FIG. 1 and a description thereof will be omitted.

Figure 6A:
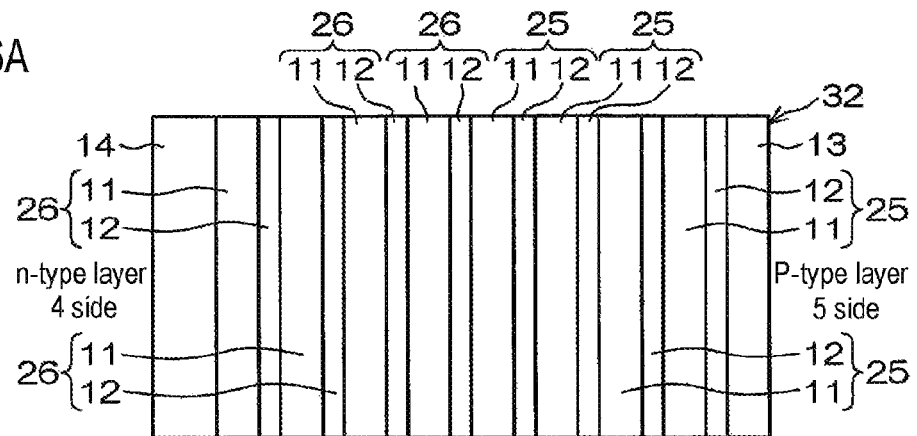
FIG. 6A is a view illustrating an emission layer of FIG. 5.
Figure 6B:
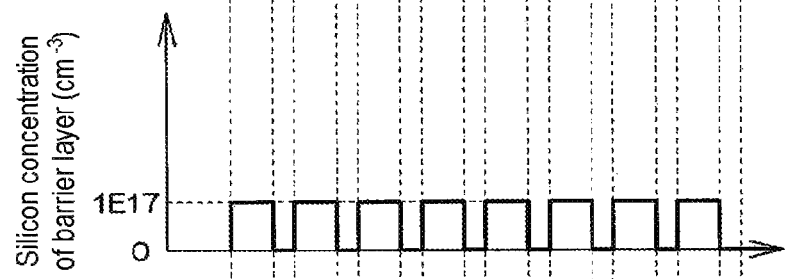
FIG. 6B is a view illustrating a silicon concentration of a barrier layer.
Figure 6C:
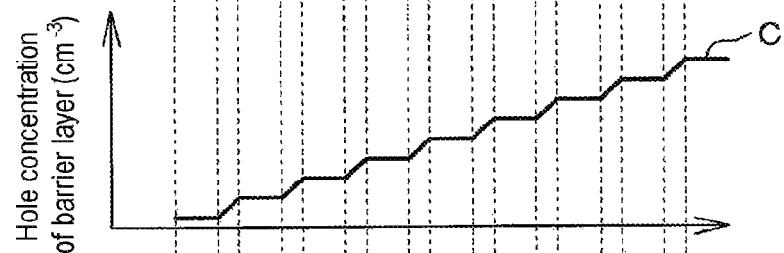
FIG. 6C is a view illustrating a hole concentration of the emission layer.
Figure 6D:
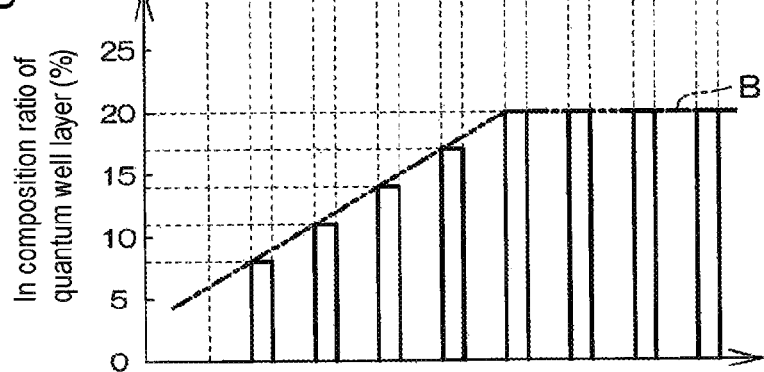
FIG. 6D is a view illustrating an In composition ratio of a quantum well layer.

FIG. 6A is a view illustrating the emission layer 32 of FIG. 5. FIG. 6B is a view illustrating a silicon concentration of a barrier layer 11. FIG. 6C is a view illustrating a hole concentration of the emission layer 32. FIG. 6D is a view illustrating an In composition ratio x of a quantum well layer 12. In FIG. 6C, a hole concentration is represented by the broken line C. In FIGS. 6A to 6D, the same reference numerals will be given to parts thereof corresponding to the parts illustrated in FIGS. 3A to 3D and a description thereof will be omitted.

As illustrated in FIGS. 6A and 6B, in the emission layer 32 of this embodiment, a plurality of barrier layers 11 are set to have an n-type impurity concentration of 0 $cm^{-3}$ or more and less than $7\times10^{17}$ $cm^{-3}$ (in some embodiments, greater than 0 $cm^{-3}$ and less than $7\times10^{17}$ $cm^{-3}$). The plurality of barrier layers 11 may be set to have the same n-type impurity concentration or may be disposed in an order in which the n-type impurity concentrations thereof are increased in a stepwise manner toward the n-type layer 4 from the p-type layer 5. The plurality of barrier layers 11 may be disposed in random order of the n-type impurity concentrations such as 0 $cm^{-3}\rightarrow1\times10^{15}$ $cm^{-3}\rightarrow\times10^{17}$ $cm^{-3}\rightarrow3\times10^{15}$ $cm^{-3}$ sequentially from the first layer within a range of n-type impurity concentrations of 0 $cm^{-3}$ or more and less than $7\times10^{17}$ $cm^{-3}$. In this embodiment, an example in which all the barrier layers 11 are set to have the same impurity concentration (=$1\times10^{17}$ $cm^{-3}$) is illustrated.

As represented by the broken line C in FIG. 6C, in this embodiment, the n-type impurity concentrations of the barrier layers 11 are adjusted such that holes reach the barrier layer 11 and the quantum well layer 12 disposed in a position closest to the n-type layer 4. In other words, in this embodiment, the n-type impurity concentrations of all the barrier layers 11 are set to be relatively small to suppress the non-radiative recombination of holes and electrons, thereby effectively suppressing hole consumption (degradation of a hole concentration).

Figure 7:
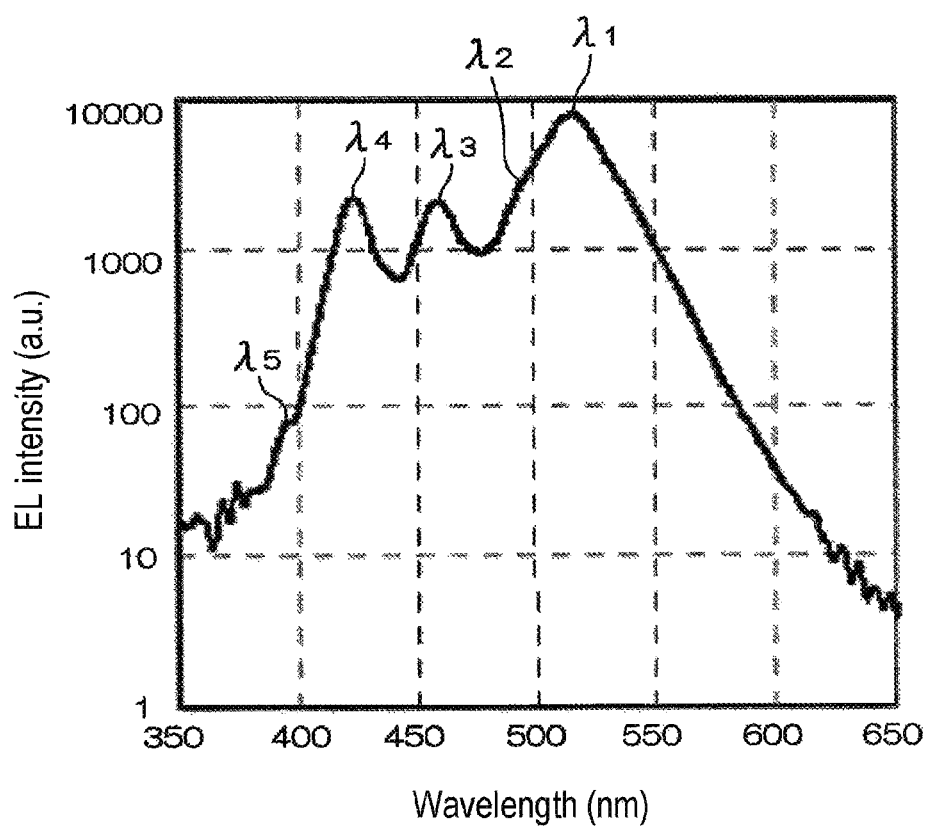
FIG. 7 is a waveform view illustrating an EL spectrum of the semiconductor light emitting device illustrated in FIG. 5.

FIG. 7 is a waveform view illustrating an EL spectrum of the semiconductor light emitting device 31 illustrated in FIG. 5. Measurement conditions of EL intensity are the same as those of the first embodiment described above.

As illustrated in FIG. 7, a first peak emission wavelength $\lambda_1$ is present within a range from 500 nm to 550 nm. Further, a second peak emission wavelength $\lambda_2$ is present within a range of 470 nm or more and less than 500 nm. Further, a third peak emission wavelength $\lambda_3$ is present within a range of 450 nm or more and less than 470 nm. Further, a fourth peak emission wavelength $\lambda_4$ is present within a range of 400 nm or more and less than 450 nm. Further, a fifth peak emission wavelength $\lambda_5$ is present within a range of 380 nm or more and less than 400 nm. Waveforms less than 380 nm are noise. In these first to fifth peak emission wavelengths $\lambda_1$ to $\lambda_5$, the first peak emission wavelength $\lambda_1$ has the largest value.

The first peak emission wavelength $\lambda_1$ includes a peak emission wavelength corresponding to the In composition ratios x (=0.2) of the plurality of quantum well layers 12 disposed at the first to fourth layers. The second peak emission wavelength $\lambda_2$ includes a peak emission wavelength corresponding to the In composition ratio x (=0.17) of the quantum well layer 12 disposed at the fifth layer. The third peak emission wavelength $\lambda_3$ includes a peak emission wavelength corresponding to the In composition ratio x (=0.14) of the quantum well layer 12 disposed at the sixth layer.

The fourth peak emission wavelength $\lambda_4$ includes a peak emission wavelength corresponding to the In composition ratio x (=0.11) of the quantum well layer 12 disposed at the seventh layer. The fifth peak emission wavelength $\lambda_5$ includes a peak emission wavelength corresponding to the In composition ratio x (=0.08) of the quantum well layer 12 disposed at the eighth layer of the lowermost layer. From the above, it is understood that all the green emission layers 25 and the blue emission layers 26 contribute to light emission.

As described above, according to this embodiment, since the plurality of barrier layers 11 are set to have the n-type impurity concentration of 0 $cm^{-3}$ or more and less than $7 \times 10^{17}$ $cm^{-3}$ (in this embodiment, the same n-type impurity concentration of $1 \times 10^{17}$ $cm^{-3}$), an electron concentration of the barrier layers 11 can be effectively reduced. Thus, as illustrated in FIG. 6C, since the non-radiative recombination of holes and electrons can be suppressed, the holes injected from the p-type layer 5 can be widely spread up to the vicinity of the n-type layer 4.

As a result, since the radiative recombination of the electrons and holes may occur even in the quantum well layer 12 disposed in a position closest to the n-type layer 4, it is possible to effectively enhance brightness. In this embodiment, as illustrated in FIG. 7, all the green emission layers 25 and the blue emission layers 26 can desirably contribute to light emission. Thus, the green light (blue light) having the first to fifth peak emission wavelengths $\lambda_1$-$\lambda_5$ within a range from 380 nm to 550 nm can be obtained with high brightness.

While the embodiments of the present disclosure have been described above, the present disclosure may also be implemented in a different form.

For example, in the foregoing embodiments, the semiconductor light emitting device 1 including the group III nitride semiconductor layer 3 using the c-plane, which is a polar plane, as a main growth surface, has been taken as an example, but a diode structure may also be formed in a group III nitride semiconductor stacked structure in which an m-plane or an a-plane, which is a non-polar plane, is used as a main growth surface. Even when a diode structure is formed in a group III nitride semiconductor layer 3 in which a semi-polar plane is used as a main growth surface, without being limited to the polar plane or non-polar plane, it is possible to enhance luminous efficiency.

Further, in the foregoing embodiments, the example in which the emission layer 6 has the MQW structure in which the barrier layers 11 and the quantum well layers 12 are alternately stacked over eight periods (i.e., eight pairs) has been illustrated. However, the stacking period of the barrier layers 11 and the quantum well layers 12 is not limited to the eight periods. Thus, the barrier layers 11 and the quantum well layers 12 may be alternately stacked over periods of one or more and less than eight periods or may be alternately stacked over periods exceeding eight periods.

Figure 8:
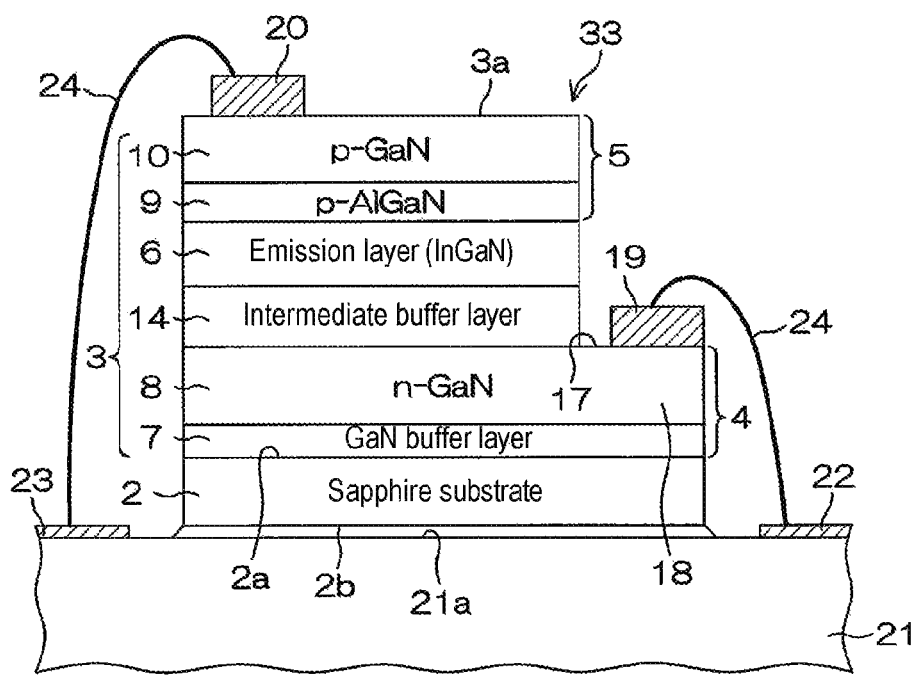
FIG. 8 is a schematic cross-sectional view illustrating a structure of a semiconductor light emitting device according to a first modification.

Further, in the foregoing embodiments, the example in which the first transparent electrode 19a and the second transparent electrode 20a are formed has been described, but the configuration illustrated in FIG. 8 may also be employed.

FIG. 8 is a schematic cross-sectional view illustrating a structure of a semiconductor light emitting device 33 according to a first modification. In FIG. 8, the same reference numerals will be given to parts thereof corresponding to the parts illustrated in FIG. 1 and a description thereof will be omitted.

The semiconductor light emitting device 33 may be the same as the semiconductor light emitting device 1 described above, except that the n-type electrode 19 does not include the first transparent electrode 19a and that the p-type electrode 20 does not include the second transparent electrode 20a. Further, only the n-type electrode 19 may include the first transparent electrode 19a or only the p-type electrode 20 may include the second transparent electrode 20a.

With this configuration, it is possible to obtain the same effect as that described in the foregoing first embodiment. It is understood that the configuration of FIG. 8 may also be applied to the semiconductor light emitting device 31 according to the second embodiment.

Further, in the foregoing embodiments, the example in which the outermost surface 3a of the group III nitride semiconductor layer 3 is the light extraction surface has been described, but the rear surface 2b of the substrate 2 may also be the light extraction surface. In this case, the configuration illustrated in FIG. 9 may be employed.

Figure 9:
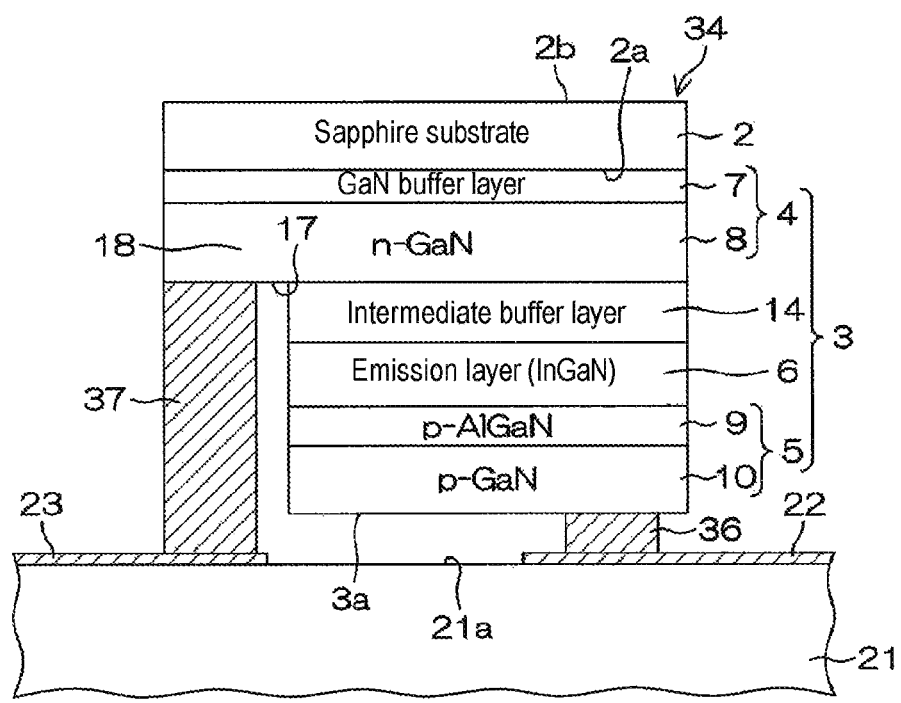
FIG. 9 is a schematic cross-sectional view illustrating a structure of a semiconductor light emitting device according to a second modification.

FIG. 9 is a schematic cross-sectional view illustrating a structure of a semiconductor light emitting device 34 according to a second modification. The semiconductor light emitting device 34 is the same as the semiconductor light emitting device 1 described above, except that the semiconductor light emitting device 34 is flipchip-connected to the support substrate 21. In FIG. 9, the same reference numerals will be given to parts thereof corresponding to the aforementioned parts illustrated in FIG. 1 and a description thereof will be omitted.

As illustrated in FIG. 9, the semiconductor light emitting device 34 is supported by the corresponding support substrate 21 in a state where the outermost surface 3a of the group III nitride semiconductor layer 3 faces the bonding surface 21a as a surface on which the first wiring 22 and the second wiring 23 of the support substrate 21 are formed. More specifically, the semiconductor light emitting device 34 is supported by the support substrate 21 through a columnar n-type electrode 36 for electrically connecting the lead-out portion 18 and the first wiring 22 and a columnar p-type electrode 37 for electrically connecting the p-type GaN contact layer 10 and the second wiring 23. In this manner, the semiconductor light emitting device 34 is flipchip-connected to the support substrate 21.

With this configuration, the rear surface 2b of the substrate 2, that is, the surface on which the n-type electrode 36 and the p-type electrode 37 are not formed, becomes the light extraction surface. Further, with this configuration, it is possible to obtain the same effect as that described in the foregoing first embodiment. It is understood that the configuration of FIG. 9 may also be applied to the semiconductor light emitting device 31 according to the second embodiment.

Further, in the foregoing embodiments, a mirror layer that is in contact with the rear surface 2b of the substrate 2 may be further formed. In other words, a mirror layer may be interposed between the substrate 2 and the support substrate 21. For example, the mirror layer may include Distributed Bragg Reflector (DBR) layer in which layers having different refractive indices from each other and having a length of one-fourth wavelength are stacked over a plurality of periods. Further, the mirror layer may include an Al layer or an Au layer instead of the DBR layers or in addition to the DBR layers.

Further, in the foregoing embodiments, the example in which the GaN buffer layer 7 is formed has been described, but the n-type GaN contact layer 8, excluding the GaN buffer layer 7, may be directly formed on the substrate 2.

Further, in the foregoing embodiments, the example in which the intermediate buffer layer 14 is formed has been described, but the emission layer 6, excluding the intermediate buffer layer 14, may be formed directly on the n-type GaN contact layer 8.

Further, in the foregoing embodiments, the example in which the green emission layers 25 (peak emission wavelength=500 nm to 550 nm) are formed at the first to fourth layers has been described. Instead, the blue emission layers 26 (peak emission wavelength=430 nm to 480 nm) may be formed by setting the In composition ratios x of the plurality of quantum well layers 12 disposed at the first to fourth layers to be, for example, 0.12 (12%) or more and less than 0.19 (19%).

Further, in the foregoing embodiments, the example in which the In composition ratios x of the plurality of quantum well layers 12 are increased sequentially from the n-type layer 4 toward the p-type layer 5 has been described, but the In composition ratios x may also be increased in random ratios (for example, 0.1→0.2→0.4, etc.).

Further, in the foregoing embodiments, the example in which the semiconductor light emitting device 1 is the light emitting diode has been described, but the present disclosure may also be applied to other forms of light emitting devices such as a nitride semiconductor laser device.

While certain embodiments have been described, these embodiments have been presented by way of example only, and are not intended to limit the scope of the disclosures. Indeed, the embodiments described herein may be embodied in a variety of other forms; furthermore, various omissions, substitutions and changes in the form of the embodiments described herein may be made without departing from the spirit of the disclosures. The accompanying claims and their equivalents are intended to cover such forms or modifications as would fall within the scope and spirit of the disclosures.

What is claimed is:

1. A semiconductor light emitting device, comprising:
an n-type layer;
a p-type layer; and
an emission layer interposed between the n-type layer and the p-type layer and having a multiple quantum well (MQW) structure in which barrier layers and quantum well layers are alternately stacked over a plurality of periods,
wherein n-type impurity concentrations of the barrier layers disposed up to a predetermined $\alpha$-th layer (where $\alpha$ is a natural number of 2 or greater), when counting from the p-type layer, are smaller than an n-type impurity concentration of the barrier layer disposed at an ($\alpha$+1)-th layer counting from the p-type layer,
wherein the barrier layers include a first group of barrier layers including each of the barrier layers disposed from the p-type layer to the predetermined $\alpha$-th layer and a second group of barrier layers including each of the barrier layers disposed from the ($\alpha$+1)-th layer to the n-type layer, and
wherein each barrier layer in the first group of barrier layers has a first n-type impurity concentration while each barrier layer in the second group of barrier layers has a second n-type impurity concentration less than the first n-type impurity concentration.

2. The device of claim 1, wherein the quantum well layer includes $In_xGa_{1-x}N$, and In (indium) composition ratios x of the quantum well layers disposed up to a predetermined $\beta$-th layer (where $\beta$ is a natural number), when counting from the p-type layer, are greater than an In composition ratio x of the quantum well layer disposed at a ($\beta$+1)-th layer, when counting from the p-type layer.

3. The device of claim 2, wherein the $\beta$ is a natural number of 2 or greater, and
the In composition ratios x of a plurality of the quantum well layers disposed at the first layer to the $\beta$-th layer, when counting from the p-type layer, are set to be the same.

4. The device of claim 2, wherein the $\beta$ is the $\alpha$.

5. The device of claim 2, wherein an In composition ratio x of the quantum well layer positioned at a certain $\gamma$-th layer (where $\gamma$ is a natural number of 2 or greater), when counting from the p-type layer, is the same as an In composition ratio x of the quantum well layer positioned at a ($\gamma$-1)-th layer, when counting from the p-type layer.

6. The device of claim 2, wherein an In composition ratio x of the quantum well layer positioned at a certain $\gamma$-th layer (where $\gamma$ is a natural number of 2 or greater), when counting from the p-type layer, is smaller than an In composition ratio x of the quantum well layer positioned at a ($\gamma$-1)-th layer, when counting from the p-type layer.

7. The device of claim 1, wherein an n-type impurity concentration of the barrier layer positioned at a certain $\delta$-th layer (where $\delta$ is a natural number of 2 or greater), when counting from the p-type layer, is the same as an n-type impurity concentration of the barrier layer positioned at a ($\delta$-1)-th layer, when counting from the p-type layer.

8. The device of claim 1, wherein an n-type impurity concentration of the barrier layer positioned at a certain $\delta$-th layer (where $\delta$ is a natural number of 2 or greater), when counting from the p-type layer, is greater than an n-type impurity concentration of the barrier layer positioned at a ($\delta$-1)-th layer, when counting from the p-type layer.

9. The device of claim 1, wherein the barrier layer includes GaN or InGaN.

10. The device of claim 1, wherein the barrier layer is doped with silicon as an n-type impurity.

11. The device of claim 1, further comprising an intermediate layer interposed between the emission layer and the n-type layer and having a stacked structure in which a first layer including $In_yGa_{1-y}N$ and a second layer including GaN are alternately stacked over a plurality of periods.

12. The device of claim 11, wherein an In composition ratio y of the first layer ranges from 0.005 to 0.1.

13. The device of claim 11, wherein the first layer has a thickness ranging from 0.5 nm to 10 nm.

14. The device of claim 11, wherein the second layer has a thickness ranging from 3 nm to 50 nm.

15. The device of claim 1, wherein the quantum well layer has a thickness ranging from 2.5 nm to 3.5 nm.

16. The device of claim 1, wherein the barrier layer has a thickness ranging from 1 nm to 20 nm.

17. The device of claim 1, wherein the n-type impurity concentration of the barrier layer ranges from 0 $cm^{-3}$ to $3 \times 10^{18}$ $cm^{-3}$.

18. The device of claim 1, wherein the In composition ratio x of the quantum well layer ranges from 0.05 to 0.25.

19. The device of claim 1, wherein the emission layer emits light having a peak light emitting wavelength within a range from 420 nm to 560 nm.

* * * * *